United States Patent [19]
Baxter

[11] Patent Number: 5,551,017
[45] Date of Patent: *Aug. 27, 1996

[54] POLYCYCLIC TIMING AND APPARATUS FOR PIPELINED COMPUTER OPERATION

[75] Inventor: Michael A. Baxter, Sunnyvale, Calif.

[73] Assignee: Apple Computer, Inc., Cupertino, Calif.

[*] Notice: The term of this patent shall not extend beyond the expiration date of Pat. No. 5,511,181.

[21] Appl. No.: 444,659

[22] Filed: May 19, 1995

Related U.S. Application Data

[63] Continuation of Ser. No. 53,724, Apr. 26, 1993.
[51] Int. Cl.$^6$ .............................. G06F 1/08; G06F 1/04
[52] U.S. Cl. .................. 395/550; 364/270; 364/270.5; 364/270.6; 364/DIG. 1
[58] Field of Search .......................... 364/270.5, 270.6, 364/270.7, 270.9, 270, 270.8; 395/550, 375; 327/19, 198, 271; 326/21

[56] References Cited

U.S. PATENT DOCUMENTS

| | | | |
|---|---|---|---|
| 4,195,352 | 3/1980 | Tu et al. | 364/900 |
| 4,386,401 | 5/1983 | O'Brien | 395/550 |
| 4,390,969 | 6/1983 | Hayes | 395/550 |
| 4,984,192 | 1/1991 | Flynn | 395/800 |
| 5,291,588 | 3/1994 | Kohtz et al. | 395/550 |

OTHER PUBLICATIONS

Huertas et al., "Self–Synchronization of Asynchronous Sequential Circuits Employing a General Clock Function", IEEE Transactions on Computers, Mar. 1976, pp. 297–300.
Joseph D. Greenfield, "Practical Digital Design Using ICs", John Wiley & Sons, 1977, pp. 135–139 and 158–194.

Primary Examiner—Kevin A. Kriess
Assistant Examiner—Dennis M. Butler
Attorney, Agent, or Firm—Greg T. Sueoka

[57] ABSTRACT

A polycyclic timing system and an apparatus for pipelined computer operation comprises a master state machine and a slave state machine. The master state marine produces a plurality of control signals in response to a clock signal. The master state machine comprises an oscillator, a plurality of data storage elements, and a next state feedback network. The oscillator is used to produce a clock signal that triggers the storage elements. The next state feedback network determines the control signals to output based on the current output data storage elements using logic in the next state feedback network. The slave state machine receives the control signals and uses them to produce several asynchronous pulse streams. The slave state machine preferably comprises a plurality of pulse forming state machines and a plurality of pulse transmission amplifiers. Each of pulse forming state machine is an edge to pulse converter that produces at least one pulse in response to a control signal received from the master state machine.

14 Claims, 3 Drawing Sheets

5,551,017

POLYCYCLIC TIMING AND APPARATUS FOR PIPELINED COMPUTER OPERATION

This is a continuation of application Ser. No. 08/053,724, filed on Apr. 26, 1993, and now pending.

BACKGROUND OF THE INVENTION

1. Field of the Invention

The present invention relates generally to high performance digital computers. In particular, the present invention relates to a system and method for generating timing pulses to optimally trigger and sequence the operation of functional units of a pipelined high-performance digital computer.

2. Description of the Related Art

One continuing problem with digital computers has been the demand for increased processing performance. This need for increased processing power has led to the development of systems operating at faster and faster clock frequencies. A number of pipelined systems have also been developed to further increase the processing performance of digital computers. However, such existing system are not able to fully realize optimum performance because of the strict adherence to either an exclusively synchronous system or an exclusively asynchronous system.

Most computer systems in the prior art are synchronous. Synchronous systems have a penalty associated with their operation since there may be differing propagation delays in various portions of the system. These propagation delays may depend on the functions being performed as well as the functional units performing the operations. For example, different portions of the circuit may have different amounts of logic, different amounts of pipeline logic, and different lengths of data paths between components. In any event, synchronous systems must account for the propagation delay of each functional unit and then set the clock period such that even the slowest function unit (i.e., the unit with the greatest propagation delays) can complete its function within a single clock period. Thus, the minimum period for the clock cycle is limited by the speed of the slowest components in the system.

This problem is further complicated by the fact that there may be significantly different delays between operations that are performed within a single chip such as a microprocessor and operations external to the chip. For example, calculations utilizing the internal registers and functional units of the microprocessor may be performed at a very fast rate while transferring the results from the microprocessor to system memory may require a rate several times slower than the rate for internal operations of the microprocessor. Thus, there is a need for a system that permits the each portion of the system to operate at its optimum speed while providing a synchronous system utilized by all portions of the system.

Another approach to increasing the speed of computer systems has been to develop asynchronous systems that do not rely on any master clock or synchronizing signal. In such asynchronous systems, each of the independent circuit units performs its function at its optimum speed and outputs the results to other components through complex protocols and methods. However, it is very difficult to model, embody, and use such systems. The asynchronous operation of such system adds many levels of complexity to the processes of designing, operating, and using such systems.

Therefore, there is a need for a pulse generator that is programmable to produce a plurality of independent pulse streams based on a synchronous master clock signal.

SUMMARY OF THE INVENTION

The present invention overcomes the limitations and shortcomings of the prior art with a polycyclic timing system and an apparatus for pipelined computer operation. The present invention advantageously comprises a master state machine and a slave state machine. The master state machine produces a plurality of control signals in response to a clock signal, and the slave state machine receives the control signals and uses them to produce several asynchronous pulse streams.

The master state machine preferably comprises an oscillator, a plurality of data storage elements, and a next state feedback network. The oscillator is used to produce a clock signal that triggers the storage elements. The plurality of data storage elements store and output several control signals. The next state feedback network determines the control signals to output based on the current output data storage elements using logic in the next state feedback network. By programming the next state feed back network, the user is able to specify the control signals that will be output by the master state machine.

The slave state machine preferably comprises a plurality of pulse forming state machines and a plurality of pulse transmission amplifiers. Each of the pulse forming state machines produces at least one pulse in response to a control signal received from the master state machine. Each of the pulse forming state machines is preferably an edge to pulse converter and comprises delay circuitry and a storage device for producing the pulse stream. Each of the pulse forming state machines has its output coupled to a respective pulse transmission amplifier to amplify and transmit the signals to the appropriate portions of a pipeline or computer system.

DETAILED DESCRIPTION OF THE PREFERRED EMBODIMENT

Figure 1:
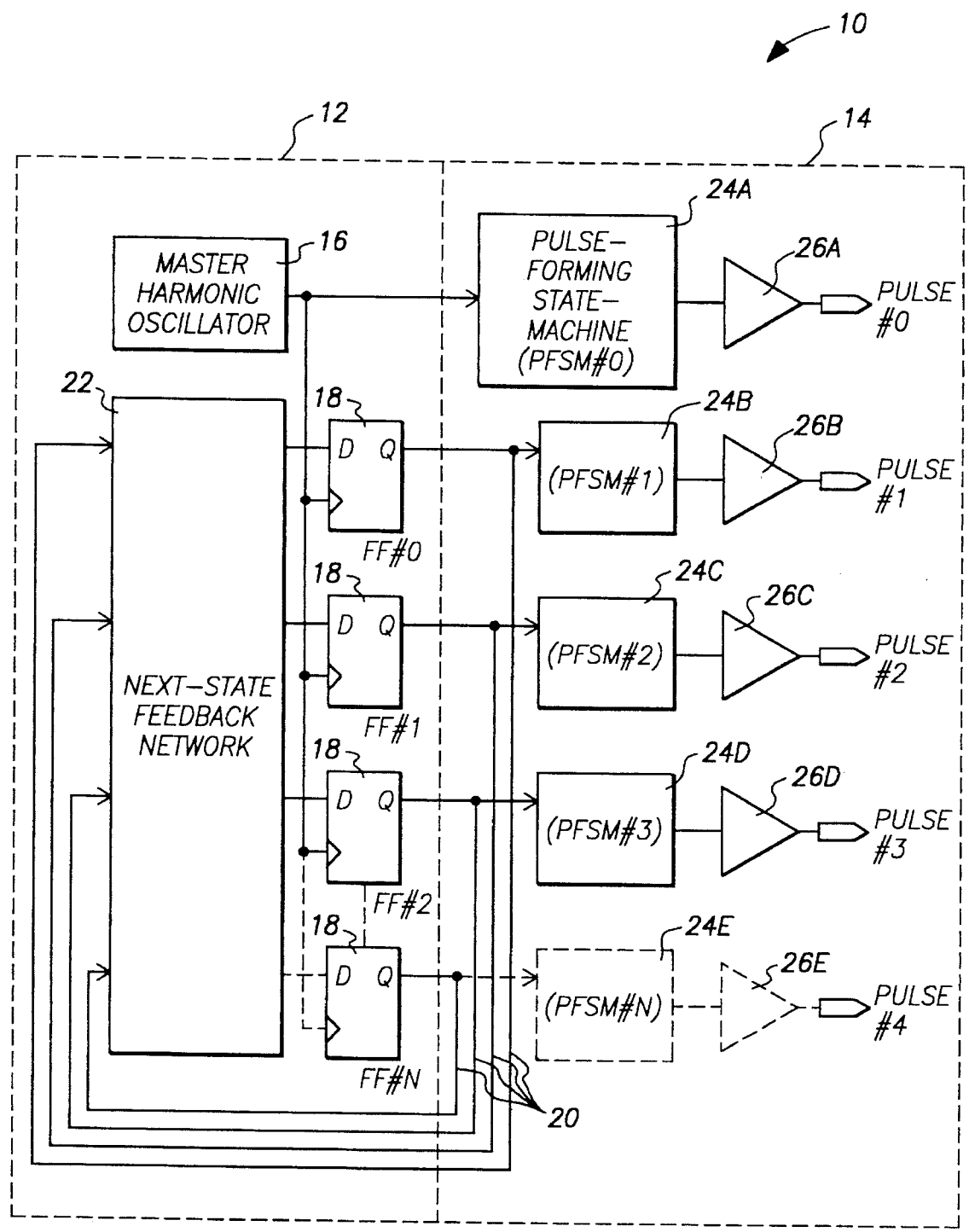
FIG. 1 is a block diagram of a preferred embodiment for the polycyclic timing system of the present invention.

The system of the present invention provides a new pulse generator 10 that utilizes the advantages of both synchronous and asynchronous systems to achieve optimum performance for digital computer systems that include pipelined logic. Instead of relying on one master time base to drive an entire pipelined system with strict phase synchrony, the system of the present invention provides a means to generate parallel independent pulse streams supplied to storage elements taken separately within a pipeline. The pulse streams signal at harmonic frequencies precisely locked to a master oscillator however, each pulse also has independently adjustable and coherent phase, though still synchronously originated.

The pulse generator 10 of the present invention relies on three fundamental principles: an unbundling principle, a natural ordering principle, and a harmonic timing principle. In a conventional pipelined computer, data is advanced through the pipeline by traversing separate ranks of storage elements which are intersticed with data path logic. Usually in such systems, storage elements for the input/output portions of the logic in a pipeline are clocked using the same time base that is used for interior data path portions of the pipeline. There is a master time base that is used for all pipeline portions. The unbundling principle is the concept that the system clock may be divided or unbundled so that different components of the system receive independent pulse streams. The pulse sequence is conceptually redistributed as separate pulses to all of the pipeline storage elements taken separately, in classes of system functionality. The present invention provides a more optimum solution where the pipelines each receive parallel and independent pulse trains, optimally arranged so that storage elements from any one pipeline stage may be arranged to switch reliably just in time for the next successive ranked stage without compromise, but while also remaining in a synchronous modality. This timing compaction effect allows the present invention to optimally merge the propagation delays between several classes of storage elements at all of the boundaries of the system.

The second principle behind the present invention is the natural ordering principle. This principle is used to define specific system boundaries where the invention provides parallel timing pulse streams to storage elements. Under the natural ordering principle, the signaling ordering (determining which storage elements receive which pulse streams) flows naturally with the order in which data processing occurs in the computer system. In the preferred embodiment, the present invention advantageously separates clocking of storage elements for the following classes of boundaries that distinguish the logic in a digital computer system: (i) internal computational data paths; (ii) internal device instruction logic; (iii) internal device control logic; (iv) internal device address logic; (v) external device-to-device interconnections for data paths; (vi) external device-to-device interconnections for instruction logic; (vii) external device-to-device interconnections for control logic; and (viii) external device-to-device interconnections for address logic. By categorizing the specific system boundaries into the eight classes above, and through explicit creation of parallel timing pulse streams to storage elements, according to the invention, the system can naturally be made to operate at an optimum rate for its technology implementation.

The third principle underlying the present invention is the harmonic timing principle. Under the harmonic timing principle, the present invention permits the number of pulses provided to any particular stage of the pipeline to be increased without increasing the pipeline cycle time. For example, the present invention is able to provide one stage with a single pulse while providing a second stage with three pulses during the same interval of time. By incorporating these three principles, the present invention is able to significantly increase the performance of pipelined digital computers.

Referring now to FIG. 1, the preferred embodiment of the present invention will be described. The preferred embodiment of the pulse generator 10 of the present invention comprises a master state machine 12 and a slave state machine 14. The master state machine 12 preferably comprises a master harmonic oscillator 16, a plurality of present state storage elements 18, a plurality of next state feed back lines 20 and a next-state feedback network 22. The master state machine 12 preferably generates a plurality of signals used to control the clocking of each stage of the pipeline (not shown). The master state machine 12 generates the control signals based upon the current state of master state machine 12, stored in the present state storage elements 18, and other logic programmed into the next-state feedback network 22. The master state machine 12 supplies a stable periodic pulse stream to the slave state machine 16.

In the exemplary embodiment, the master harmonic oscillator 16 is a highly stable harmonic oscillator involving any coherent frequency locking means. For example, the master harmonic oscillator 16 may be a crystal oscillator producing a clock signal with a frequency of 40 MHz with a 50% duty cycle. Those skilled in the are will realize that the frequency of the clock sisal produce by the master harmonic oscillator 16 may vary as the speed of the pipeline components continues to increase. The output of the master harmonic oscillator 16 is preferably coupled to each of the plurality of present state storage elements 18. The output signals of the master harmonic oscillator 16 is use to clock each present state storage elements 18, thereby providing the synchronous modality since each of the present state storage elements 18 will change state at edge of the clock pulse applied from the master harmonic oscillator 16.

As shown in FIG. 1, master state machine 12 includes a plurality of present state storage elements 18. The storage elements 18 are used to store and output the various states of the master state machine 12. In the preferred embodiment, the number of storage elements 18 is equal in number to the pipeline stages requiring different clocks signals for optimum operation. While the preferred embodiment only shows four present state storage elements 18 providing 4 potentially different clocking signals for the system, those skilled in the art will realize that any number of different clock signals may be produced by master state machine 12 by adding additional present state storage elements 18 and the necessary control logic in the next state feed back network 22. Each of the storage elements 18 is preferably a binary storage device such as a D-type flip-flop. The storage elements 18 may also be comprised of JK-type flip-flops, T-type flip-flops or other similar storage devices. The clock input of each storage element 18 is preferably coupled to receive a clock signal from the master harmonic oscillator 16, as has been described above. The data input of each of the storage elements 18 is preferably coupled to a respective data output of the next state feedback network 22. Additionally, the output of each of the storage elements 18 is coupled by a next state feed back line 20 to an input of the next-state feedback network 22. The output of each storage element 18 is also coupled to transmit the output to the slave state machine.

In the preferred embodiment, the next-state feedback network 22 has a plurality of inputs and a plurality of outputs. The number of outputs is preferably equal to the number of inputs, and equal to the number of storage elements 18. The next-state feedback network 22 is programmed to use the current state of the storage elements 18 and produce the next state for the master state machine 12. Based on the outputs of the storage elements 18, the next-state feedback network 22 generates the next state for each storage element on the outputs. Each input of the next-state feedback network 22 is coupled to the output of a respective storage element 18 by a next state feed back line 20. The outputs of the next-state feedback network 22 are each coupled to the input of a respective storage elements 18. In the preferred embodiment, the next-state feedback network 22 is a programmable logic array (PLA) with AND/OR logic to generate the next state outputs based on the current state of the storage elements. The next-state feedback network 22 is preferably programmed to produce states in sequence that are clocked and stored in the storage elements 18 then passed to the slave state machine 14 such that each stage of the pipeline is sequentially docked to pass the data through the pipeline at an optimum speed.

Referring again to FIG. 1, the preferred embodiment for the asynchronous slave state machine 14 will be described. The slave state machine 14 preferably comprises a plurality of pulse forming state machines 24a–24e and a plurality of pulse transfer-amplifiers 26a–26e. The slave state machine 14 provides the precision pulse delay and drive hardware necessary to transform the steady state pulses output by the master state machine 12 in to a precisely calibrated edge-to-edge asynchronous pulse streams. In the preferred embodiment, there are n+1 pulse forming state machines 24a–24e, where n is the number of storage elements 18 in the master state machine 12. As shown in FIG. 1, there are preferably five pulse forming state machines 24a–24e. Those skilled in the art will realize that the number of pulse forming state machines 24a–24e may be varied according to the number of storage elements 18 in the master state machine 12. Each of the pulse forming state machines 24a–24e has an input and output. In response to an edge on the input, each of the pulse forming state machines 24a–24e produces one or more pulses at the output. The timing, period and number of pulses produced by each pulse forming state machines 24a–24e may be varied by modifying the respective pulse forming state machine 24a–24e. The first pulse forming state machine 24a has its input directly coupled to the output of the master harmonic oscillator 16. Each of the remaining pulse forming state machines 24b–24e has its input coupled to the output of a respective storage element 18. The stable periodic pulse streams produced by the master state machine 12 are output by the storage elements 18 to the inputs of respective pulse forming state machines 24b–24e. In turn, the output of each pulse forming state machines 24a–24e is coupled to the input of a respective pulse transfer amplifier 26a–26e. Each of the pulse transfer amplifier 26a–26e amplifies the signals from the corresponding pulse forming state machines 24a–24e, and then outputs them to the appropriate pipeline stage as the clock signal. Thus, as shown in FIG. 1, the present invention will produce 5 different clock signals, with each clock signal being tailored to take advantage of the capabilities of each pipeline stage.

Figure 2:
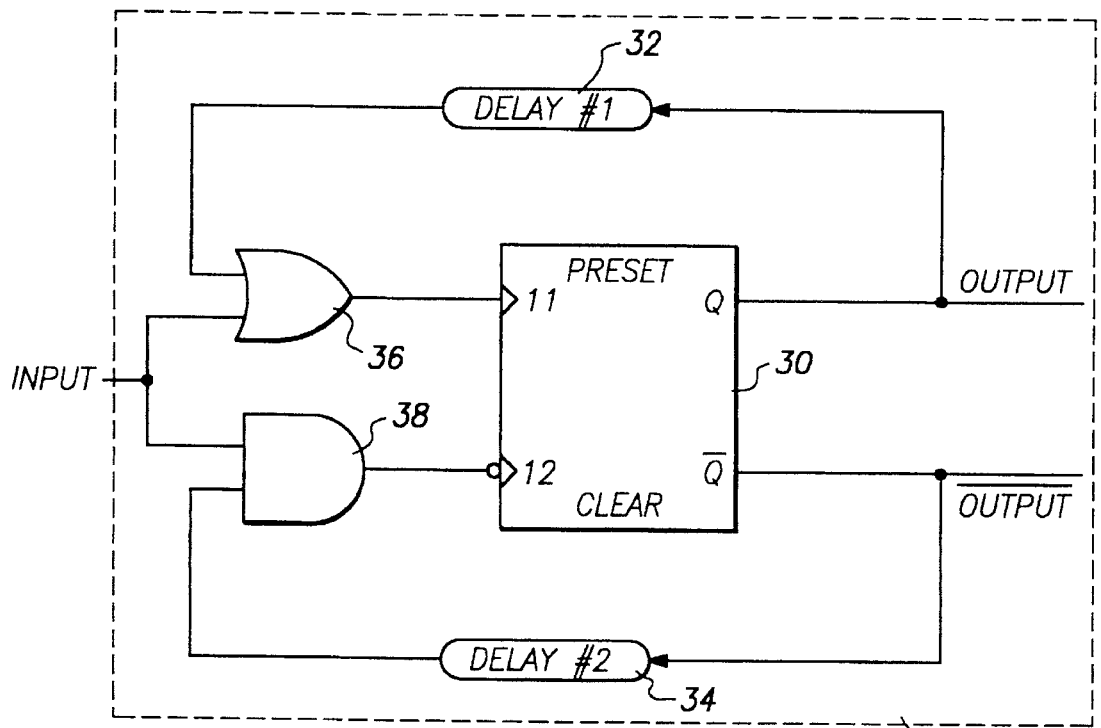
FIG. 2 is a block diagram of a first embodiment for the pulse forming state machines.

Referring now to FIG. 2, a first embodiment for a pulse forming state machine 24 is shown. The circuit shown in FIG. 2 is a reproduction of FIG. 10 of U.S. Pat. No. 4,980,577, and provides one example of a circuit that may be used as the pulse forming state machine 24. The first embodiment of the pulse forming state machine 24 provides a device for producing a single pulse in response to a rising edge on the signal from the master state machine 12. The first embodiment also demonstrates the capability of varying the pulse width and pulse start time for pulses produced by the first embodiment of the pulse forming state machine 24. The first embodiment for the pulse forming state machine 24 is an edge to pulse converter and preferably comprises a dual T-type flip-flop 30, a first delay circuit 32, a second delay circuit 34, an OR-gate 36 and an AND-gate 38. The T-type flip-flop 30 preferably comprises a first and second inputs, an output (Q) and an inverted output (Q'). The output of the T-type flip-flop 30 is coupled through the first delay circuit 32 to an input of the OR-gate 36. The other input of the OR-gate 36 is coupled to receive an input signal from the master state machine 12. The output of OR-gate 36 is coupled to the first input of the T-type flip-flop 30. This provides a path for the T-type flip-flop 30 to be set to produce a high to low transition. The inverted output of the T-type flip-flop 30 is coupled through the second delay circuit 34 to an input of the AND-gate 38. The other input of the AND-gate 38 is coupled to receive the input signal from the master state machine 12. The output of the AND-gate 38 is coupled to the second input of the T-type flip-flop 30. The second delay circuit 34 provides a mechanism for changing the output of the T-type flip-flop 30 to produce a low to high transition on the Q signal. The delay times provided by the first and second delay circuits 32, 34 are advantageously variable such that the pulse width and beginning of the pulse may be set to occur any time within a period of the clock signal output by the harmonic oscillator 16 by varying the delay time provided by each of the delay circuits 32, 34. Therefore, by using different forms for the pulse forming state machine 24 the pulse widths, pulse repetition rate and pulse periods can be varied according to the needs of each stage of the pipeline.

Figure 3:
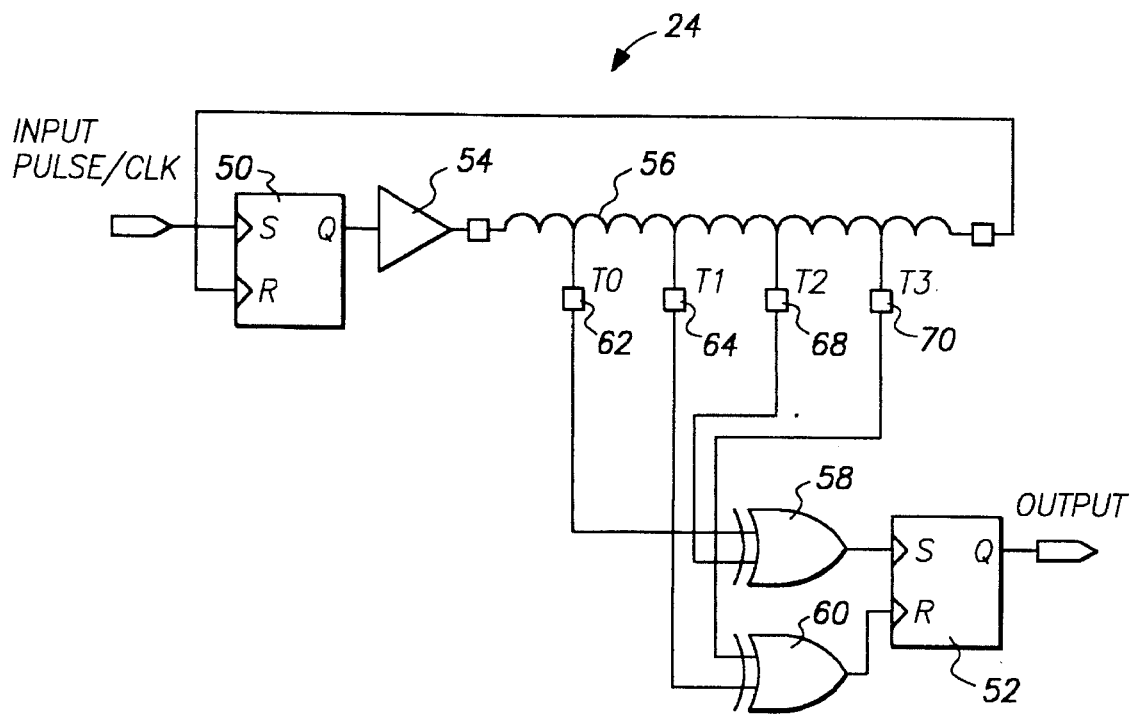
FIG. 3 is a block diagram of a second embodiment for the pulse forming state machine.

Referring now to FIG. 3, a second and preferred embodiment for a pulse forming state machine 24 is shown. The second embodiment illustrates a pulse forming state machine 24 that produces multiple pulses within a single clock period of the master harmonic oscillator 16. The second embodiment of the pulse forming state machine 24 produces two pulses at additional points throughout the master clock pulse period. The second embodiment of the pulse forming state machine 24 preferably comprises a first flip-flop 50, a second flip-flop 52, a line driver 54, a transmission line 56, a first exclusive-or gate 58 and a second exclusive-or gate 60. The first and second flip-flops 50, 52 are preferably edge triggered SR flip-flops. The set input of the first flip-flop 50 is coupled to receive a clocking signal or pulse from the master state machine 12. The output (Q) of the first flip-flop 50 is preferably coupled to the input of the line driver 54, and the output of the line driver 54 is in turn coupled to the input to the transmission line 56.

The transmission line 56 preferably has a length that is determined by the propagation delay through the transmission line 56 and the period of the clock signal input by the master state machine 12. The transmission line 56 is preferably a length that provides a propagation delay less than the period of the clock signal input by the master state machine 12. In particular, the propagation delay of the transmission line ($t_{line}$) is less than the period of the clock of the master state machine 12 ($t_p|clk$) minus the propagation delay through the first flip-flop 50 ($t_{pd}|ff1$) and the propagation delay through the line driver 54 ($t_{pd}|ld$). In other words, $$r_{line} < t_p|clk - t_{pd}|ff1 - t_{pd}|ld.$$

The transmission line 56 may also have any number of taps, and the embodiment shown in FIG. 3 is provided with a first tap T0 62, a second tap T1 64, a third T2 68, and a fourth tap T3 70 only by way of example. Those skilled in the art will realize that the circuit is expandable to provide more taps, and thus pulses, using addition exclusive-or gates. Moreover, the signals from the taps 62, 64, 68, 70 could also be shared with other pulse forming state machines. The four taps 62, 64, 68, 70 are preferably spaced apart equally to provide similar clock periods of each of the pulses generated. The taps 62, 64, 68, 70 are used to provide four edges as the clock signal propagates through the transmission line 56. The second end of the transmission line is preferably coupled to the reset input of the first flip-flop 50. Thus, once the signal propagates through the transmission line 56, it returns to reset the first flip-flop 50.

The four edges provided by the taps 62, 64, 68, 70 of the transmission line 56 are converted to clock pulses using the second flip-flop 52, the first exclusive-or gate 58 and the second exclusive-or gate 60. The first and second exclusive-or gates 58, 60 are preferably two-input exclusive-or gates. The first exclusive-or gate 58 has one input coupled to the first tap 62 and the second input coupled to the third tap 68. The output of the first exclusive-or gate 58 is coupled to the set input of the second flip-flop 52. The second exclusive-or gate 60 has one input coupled to the second tap 64 and the second input coupled to the fourth tap 70. The output of the second exclusive-or gate 60 is then coupled to the reset input of the second flip-flop 52. The Q output of the second flip-flop 52 provides the output for the pulse forming state machine 24.

The preferred operation of the second embodiment of the pulse forming state machine 24 is as follows. First, the master clock signal is received by the first flip-flop 50. The first rising edge sets the first flip-flop 50, and outputs a signal to the line driver 54. After propagation delay, the line driver 54 outputs the signal across the transmission line 56. After the propagation delay through the transmission line 56, which may be close to the remainder of the period of the master clock signal, the signal is input to the reset input of the first flip-flop 50. This pulse at the end of the transmission line 56 occurs once every cycle of the master clock signal period to reset the first flip-flop 50 and prepare the first flip-flop 50 for successive re-triggering by the master clock signal.

As the pulse from the line driver 54 proceed through the transmission line 56, each tap 62, 64, 68, 70 produces a rising edge. Each of the edges are separated by the propagation delay of the portion of the transmission line 56. Pulses are formed since the wave forms at T0, T1, T2, and T3 resemble a shift register sequence, but driven at a much higher frequency time base and where delay between successive edges is independently controlled through the location of the taps 62, 64, 68, 70 in the transmission line 56. The signals at the taps 62, 64, 68, 70 are the converted to edges by the gates 58, 60 and the second flip-flop 52 in into two pulses per master clock cycle. Modulo-2 addressed gates 68, 70, which have programmable connections to the taps 62, 64, 68, 70 of the transmission line 56, detect selected edge differences to provide positive edges to the second flip-flop 52. The second flip-flop 52 then turns these edges into pulses. Those skilled in the art will realize similar circuits may be used to create more than two pulses where additional taps are provided.

Moreover, those skilled in the art will also realize that a variety of combinations of the above pulse forming state machines 24 may be combined to apply various clock signals to different pipeline stages. As best shown by the pulse forming state machines of FIGS. 2 and 3, the number of whole repetitive pulses output to each pipeline stage and used to trigger flip-flop elements between independent pipelined functional units can be varied by using different pulse forming state machines. This advantageously allows devices within the independent pipeline stages to have different path lengths, in terms of the number of successively ranked flip-flop storage elements applied to each path, while not simultaneously increasing the pipeline-cycle time at boundaries where the pipeline stages exchange data or where data is exchanged with other pipelined system elements such as a central memory bank. Moreover, the present invention allows the number of successively ranked flip-flop storage elements within any one pipeline stage to be dynamically assignable. For example, the length of a particular pipeline in a functional unit may be beneficially changed for the duration required to execute one alternative instruction, and then changed back to another length for other instructions. In either case, the resultant system cycle remains constant at the boundaries between functional units. The system, through the pulse forming state machines, can generate three pulses that are harmonically related to the master time base (the clock signal output by the harmonic oscillator 16) for one instruction, and then the same means can generate four pulses that are harmonically related to the master time base for a second instruction while using exactly the same amount of time to execute either instruction.

Figure 4:
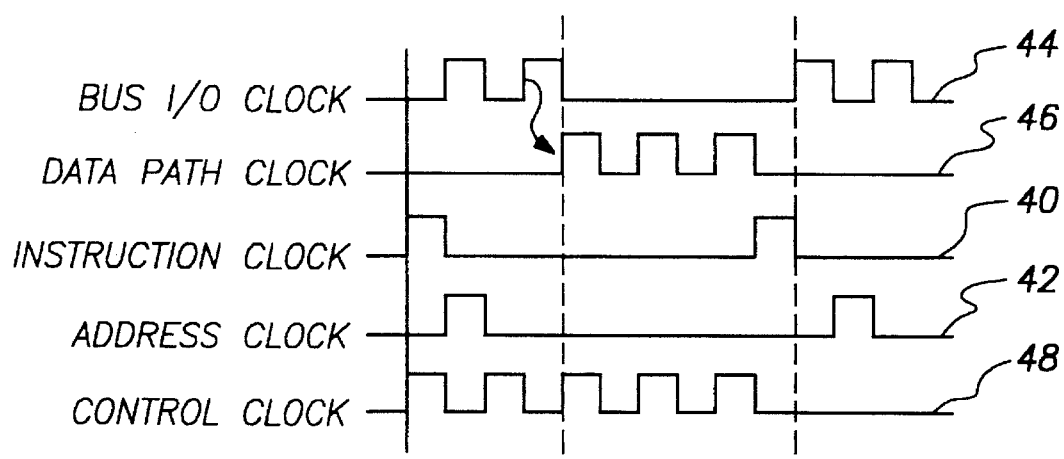
FIG. 4 is a timing diagram for the signals output by the polycyclic pulse generator.

Referring now to FIG. 4, a timing diagram for a polycyclic timing system with five different time bases that could be produced using the preferred embodiment of the present invention will be described. The time bases are preferably produced to dock successive ranks of flip-flops storage elements in a high-performance pipelined computer according to the natural ordering principle described above. The five time bases preferably includes an instruction clock signal 40, an address clock 42, a bus I/O clock 44, an internal data path clock 46, and a control clock 48. As shown in FIG. 4, the arrows are used to indicate positive edge clocking polarity, however, those skilled in the art will realize that other polarity may be produced by the present invention according to the requirements of the pipeline. Moreover, pulse widths are generally shown to be the same for ease of illustration, and the present invention provides time delays between edges that can be specifically set. Both the pulse widths and the times delays between pulse can be set to predetermined values as has been noted above. In an exemplary embodiment, the period between the bursts of two pulses at which the bus I/O clock 44 signals could be about 25 nanoseconds or two asserted edges that are recurring at 40 MHz. However, the frequencies for repeated clusters could be as high as 200 MHz for high performance embodiments.

While the present invention has been described with reference to certain preferred embodiments, those skilled in the art will recognize that various modifications may be provided. For example, there may be other embodiments for the pulse forming state machines in addition to those described with reference to FIGS. 2 and 3. Similarly, there may be other embodiments for the next-state feed back network 22 such as through combinational logic. These and other variations upon and modifications to the preferred embodiment are provided for by the present invention which is limited only by the following claims.

What is claimed is:

1. An apparatus for generating a plurality of clock signals synchronously originated with independent phase, said apparatus comprising:

a master state machine having a first and a second output, and including an oscillator that generates a master clock signal, said master state machine producing a first and a second synchronous control signal in response to the master clock signal, said master state machine providing the first synchronous control signal at the first output and the second synchronous control signal at the second output; and a slave state machine having a first and a second input and a first and a second output, the slave state machine receiving the first and second synchronous control signals from the master state machine at the first and second inputs, respectively, the slave state machine producing a first asynchronous pulse stream at the first output of the slave state machine in response to the first synchronous control signal and producing a second asynchronous pulse stream at the second output of the slave state machine in response to the second synchronous control signal.

2. The apparatus of claim 1, wherein the master state machine further comprises:

a plurality of data storage elements each having a data input, a data output and a clock input; each data storage element storing and outputting a respective control signal, the clock input of each of the data storage elements coupled to the oscillator to receive the master clock signal, the data output of one of the plurality of data storage elements providing the second synchronous control signal; and a next state feedback network having a plurality of inputs and a plurality of outputs, the next state feedback network determining the next state of the plurality of data storage elements, each of the plurality of inputs coupled to a respective data output of the plurality of data storage elements, and each of the plurality of outputs of the next state feedback network coupled to a respective data input of the data storage elements.

3. The apparatus of claim 1, wherein the oscillator is a master harmonic oscillator.

4. The apparatus of claim 2, wherein the data storage elements are selected from the group consisting of D-type, JK-type, and T-type flip-flops.

5. The apparatus of claim 2, wherein the next state feedback network is a programmable logic array.

6. The apparatus of claim 2, wherein the next state feedback network is a Boolean tree.

7. The apparatus of claim 1 wherein the slave state machine further comprises:

a plurality of pulse forming state machines, each of said pulse forming state machines having an input and an output for producing at least one pulse in response to a signal on the input, the inputs of the plurality of pulse forming state machines each coupled to receive a signal from the master state machine; and a plurality of pulse transmission amplifiers, each having an input and an output for receiving, amplifying and then outputting a signal, the input of each pulse transmission amplifier coupled to the output of a respective pulse forming state machine.

8. The apparatus of claim 7, wherein the pulse forming state machines are edge to pulse converters.

9. The apparatus of claim 8, wherein each of the pulse forming state machines further comprise:

a dual trigger flip-flop having a first trigger input, a second trigger input, and output and an inverted output;

a first delay circuit having an input and an output, the input of the first delay circuit coupled to the output of the flip-flop;

a second delay circuit having an input and an output, the input of the second delay circuit coupled to the inverted output of the flip-flop;

an AND gate having a first input and a second input and an output, the output of the AND gate coupled to the second trigger input, the first input of the AND gate coupled to the output of the second delay circuit, and the second input coupled to receive a signal from the master state machine; and an OR gate having a first and a second inputs and an output, the output of the OR gate coupled to the first trigger input, the first input of the OR gate coupled to the output of the first delay circuit, and the second input of the OR gate coupled to receive a signal from the mater state machine.

10. The apparatus of claim 8, wherein each of the pulse forming state machines further comprise:

an edge responsive circuit with an input and an output, the input receiving one of the control signals from one of the master state machine data storage elements; and a delay circuit, connected to the output of the edge responsive circuit, whereby the parameters of the pulses formed by the pulse forming state machines are controllable.

11. The apparatus of claim 8, wherein each of the pulse forming state machines further comprise:

a first flip-flop having a set input, a reset input, and an output, the set input of the first flip-flop coupled to receive a signal from the master state machine;

a transmission line having a first end, a second end and a plurality of taps there between, the first end coupled to the output of the first flip-flop, and the second end coupled to reset input of the first flip-flop;

a first gate having a first and second inputs and an output, the first input of the first gate coupled to one of the plurality of taps, the second input of the first gate coupled to one of the plurality of taps;

a second gate having a first and second inputs and an output, the first input of the second gate coupled to one of the plurality of taps, the second input of the second gate coupled to one of the plurality of taps; and a second flip-flop having an set input, a reset input, and an output, the set input of the second flip-flop coupled to output of the first gate and the reset input of the second flip-flop coupled to output of the second gate, the output of the second flip-flop providing the output of the pulse forming state machine.

12. The apparatus of claim 11, wherein the pulse forming state machines further comprise a line driver coupled between the output of the first flip-flop and the transmission line for driving the signal output by the first flip-flop across the transmission line.

13. The apparatus of claim 11, wherein the first and second gates are exclusive-or gates.

14. The apparatus of claim 11, wherein the transmission line has a first tap, a second tap, a third tap, and a fourth tap, the first tap coupled to the first input of the first gate, the second tap coupled to the first input of the second gate, the third tap coupled to the second input of the first gate, and the fourth tap coupled to the second input of the second gate.

* * * * *